(12) United States Patent
Twynam

(10) Patent No.: US 10,403,723 B2
(45) Date of Patent: Sep. 3, 2019

(54) SEMICONDUCTOR DEVICE AND SEMICONDUCTOR CIRCUIT INCLUDING THE DEVICE

(71) Applicant: LG INNOTEK CO., LTD., Seoul (KR)

(72) Inventor: John Twynam, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 352 days.

(21) Appl. No.: 15/101,197

(22) PCT Filed: Jan. 17, 2014

(86) PCT No.: PCT/KR2014/000520
§ 371 (c)(1),
(2) Date: Jun. 2, 2016

(87) PCT Pub. No.: WO2015/083888
PCT Pub. Date: Jun. 11, 2015

(65) Prior Publication Data
US 2016/0372555 A1    Dec. 22, 2016

(30) Foreign Application Priority Data
Dec. 2, 2013   (KR) .................. 10-2013-0148331

(51) Int. Cl.
*H01L 29/205* (2006.01)
*H01L 29/872* (2006.01)
(Continued)

(52) U.S. Cl.
CPC ........ *H01L 29/205* (2013.01); *H01L 27/0605* (2013.01); *H01L 27/0629* (2013.01);
(Continued)

(58) Field of Classification Search
None
See application file for complete search history.

(56) References Cited

U.S. PATENT DOCUMENTS 9,099,564 B2 * 8/2015 Saito .................. H01L 29/0623
2002/0127787 A1   9/2002 Huang et al.
(Continued)

FOREIGN PATENT DOCUMENTS

| CN | 102623493 | 8/2012 |
| CN | 103201840 | 7/2013 |
| KR | 10-2013-0004707 A | 1/2013 |

OTHER PUBLICATIONS

International Search Report and Written Opinion dated Aug. 27, 2014 issued in Application No. PCT/KR2014/000520 (with English translation).
(Continued)

*Primary Examiner* — Robert K Carpenter
(74) *Attorney, Agent, or Firm* — KED & Associates, LLP

(57) ABSTRACT

A semiconductor device is disclosed. The semiconductor device includes a second conductive type substrate including a first first-conductive-type doping layer and a plurality of devices on the second conductive type substrate, wherein a first device of the devices includes a first nitride semiconductor layer on the first first-conductive-type doping layer, a second nitride semiconductor layer brought together with the first nitride semiconductor layer to form a first heterojunction interface, between the first first-conductive-type doping layer and the first nitride semiconductor layer, a first contact electrically connected to the first heterojunction interface, and a contact connector electrically connecting the first contact to the first first-conductive-type doping layer.

13 Claims, 7 Drawing Sheets

(51) Int. Cl.
   *H01L 29/778* (2006.01)
   *H01L 29/36* (2006.01)
   *H01L 29/20* (2006.01)
   *H01L 27/06* (2006.01)
   *H01L 27/095* (2006.01)
   *H01L 27/08* (2006.01)
   *H01L 29/417* (2006.01)
   *H01L 27/085* (2006.01)
   *H01L 49/02* (2006.01)
   *H01L 21/8252* (2006.01)
   *H01L 27/02* (2006.01)

(52) U.S. Cl.
   CPC ........ *H01L 27/0676* (2013.01); *H01L 27/085* (2013.01); *H01L 27/0814* (2013.01); *H01L 27/095* (2013.01); *H01L 28/10* (2013.01); *H01L 28/40* (2013.01); *H01L 29/2003* (2013.01); *H01L 29/36* (2013.01); *H01L 29/417* (2013.01); *H01L 29/41766* (2013.01); *H01L 29/7787* (2013.01); *H01L 29/872* (2013.01); *H01L 21/8252* (2013.01); *H01L 27/0207* (2013.01)

(56) References Cited

U.S. PATENT DOCUMENTS

| | | |
|---|---|---|
| 2010/0019279 A1 | 1/2010 | Chen et al. |
| 2012/0153300 A1* | 6/2012 | Lidow .................. H01L 21/743 257/77 |
| 2012/0267640 A1 | 10/2012 | Wu et al. |
| 2013/0153967 A1 | 6/2013 | Curatola et al. |
| 2013/0221371 A1 | 8/2013 | Nakazawa et al. |

OTHER PUBLICATIONS

Chinese Office Action dated Oct. 12, 2018 issued in Application No. 201480065839.1 (with English Translation).

* cited by examiner

[Fig. 1]
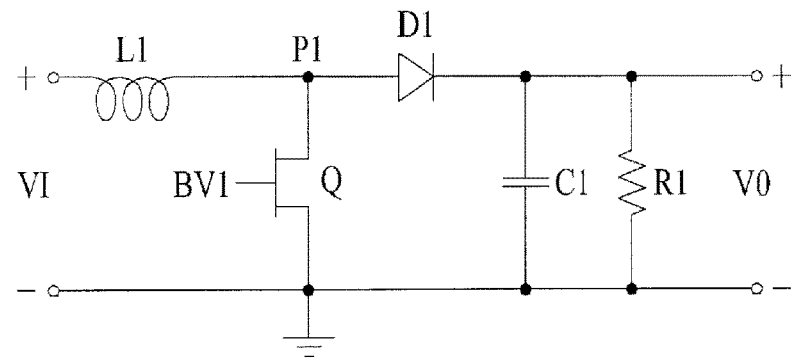
[Fig. 2]
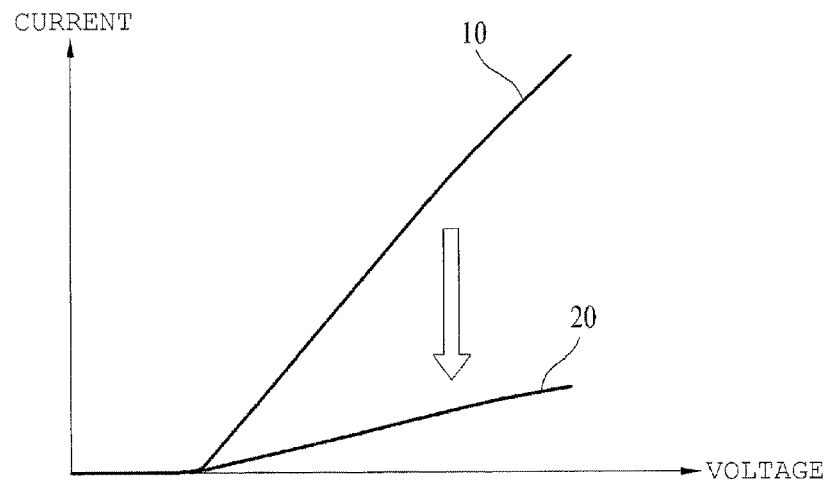
[Fig. 3]
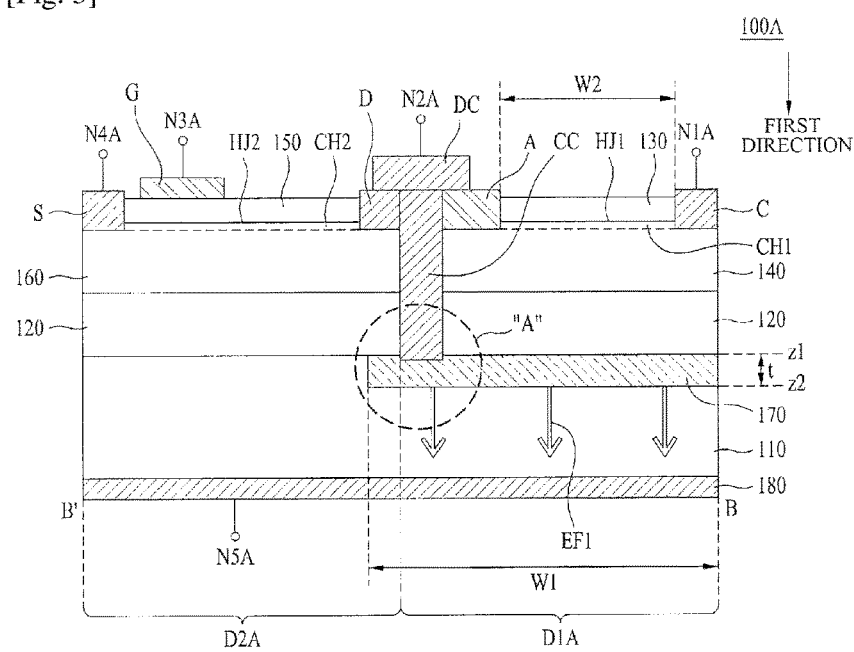

[Fig. 4]
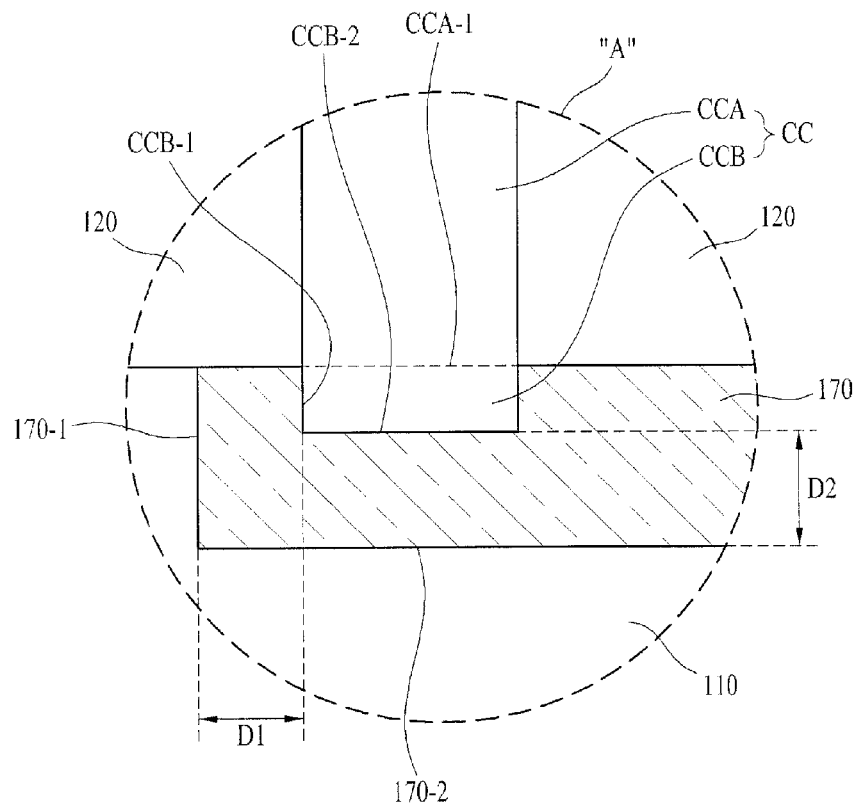
[Fig. 5]
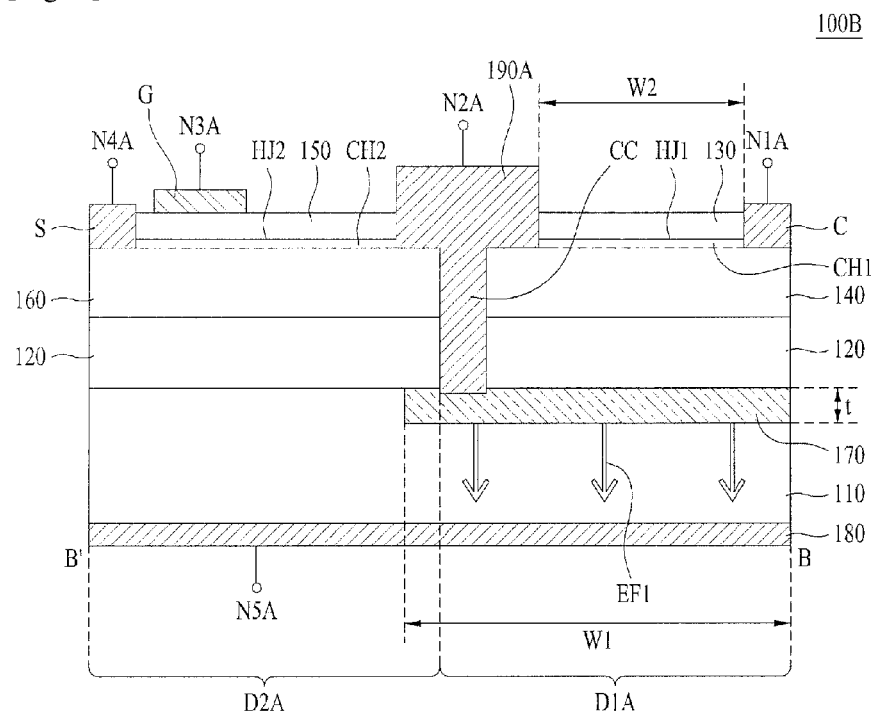

[Fig. 6]
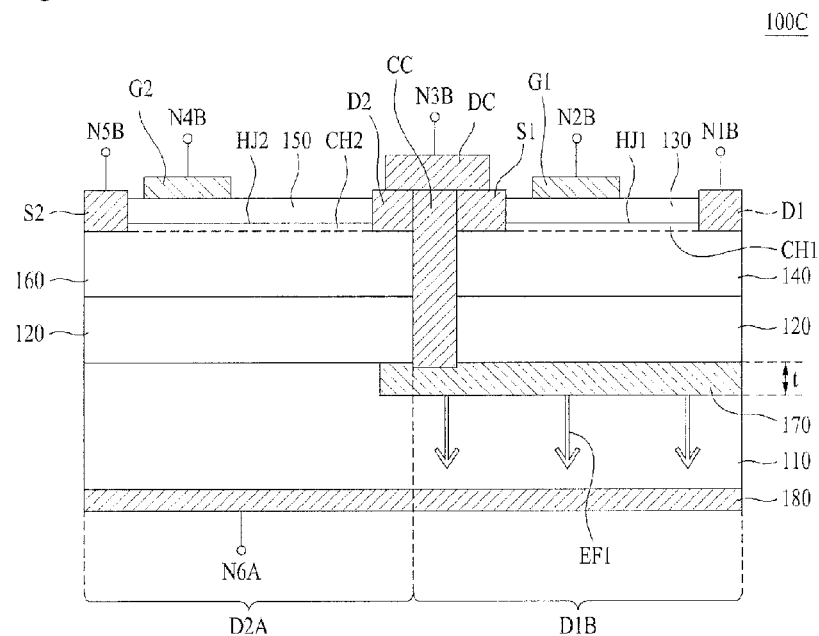
[Fig. 7]
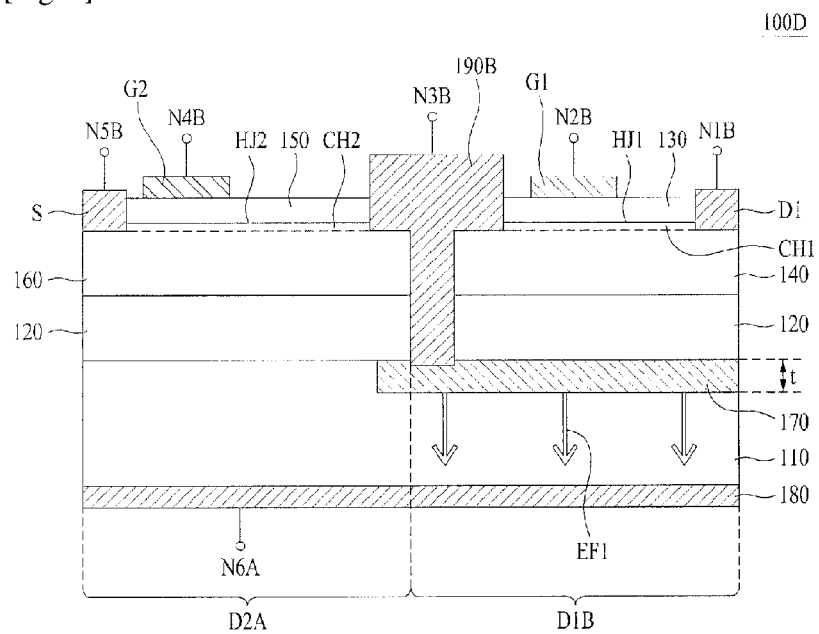
[Fig. 8]
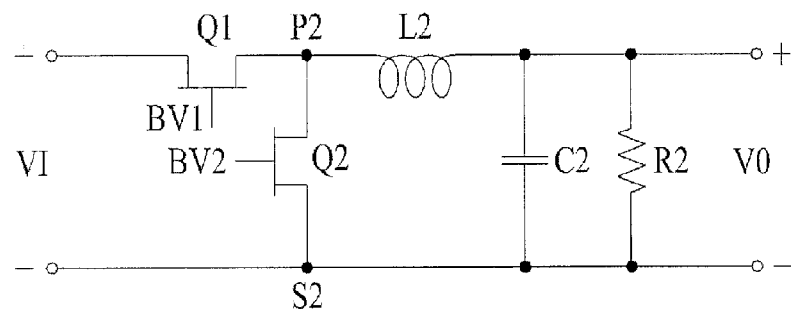

[Fig. 9]
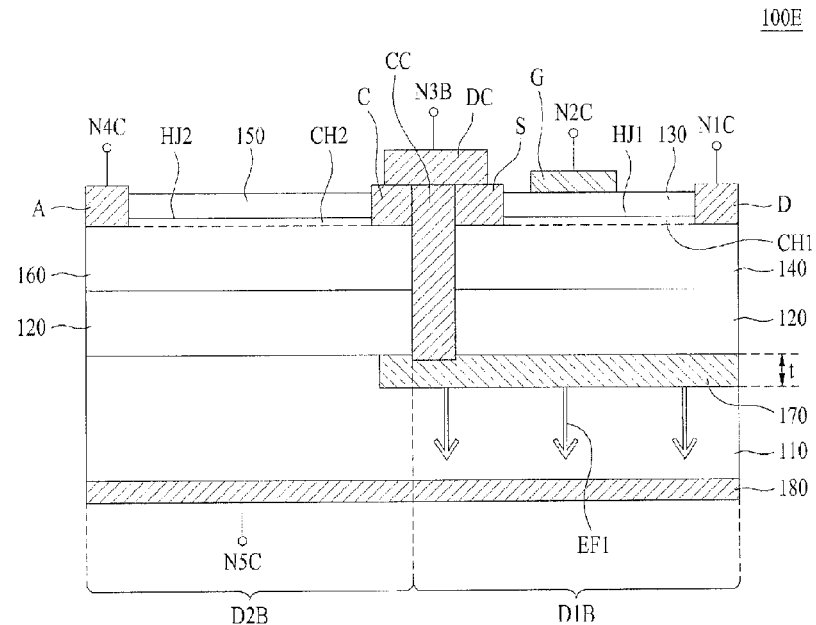
[Fig. 10]
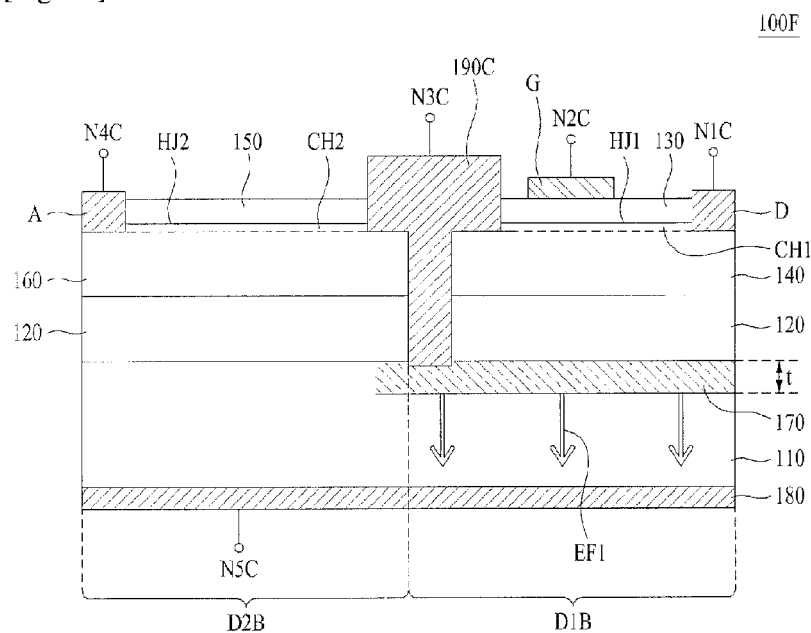
[Fig. 11]
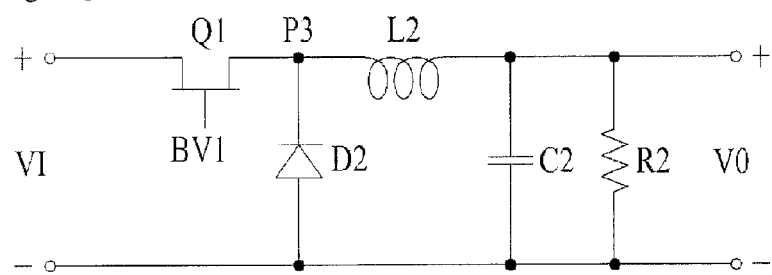

[Fig. 12]
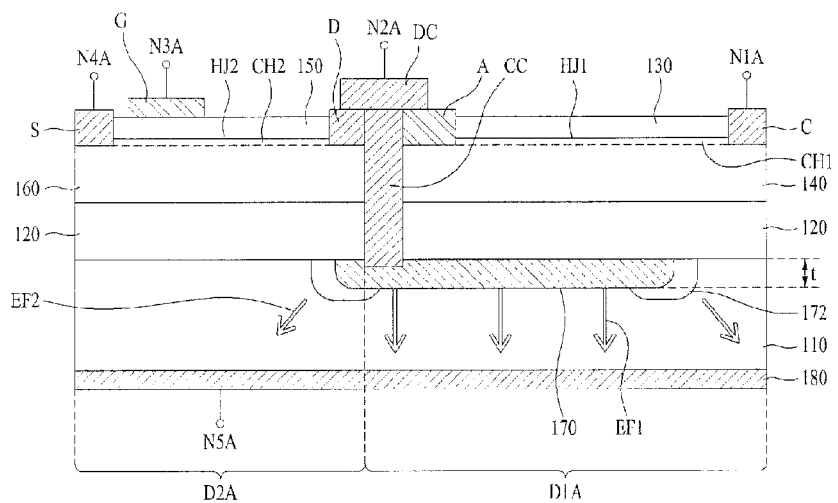
[Fig. 13]
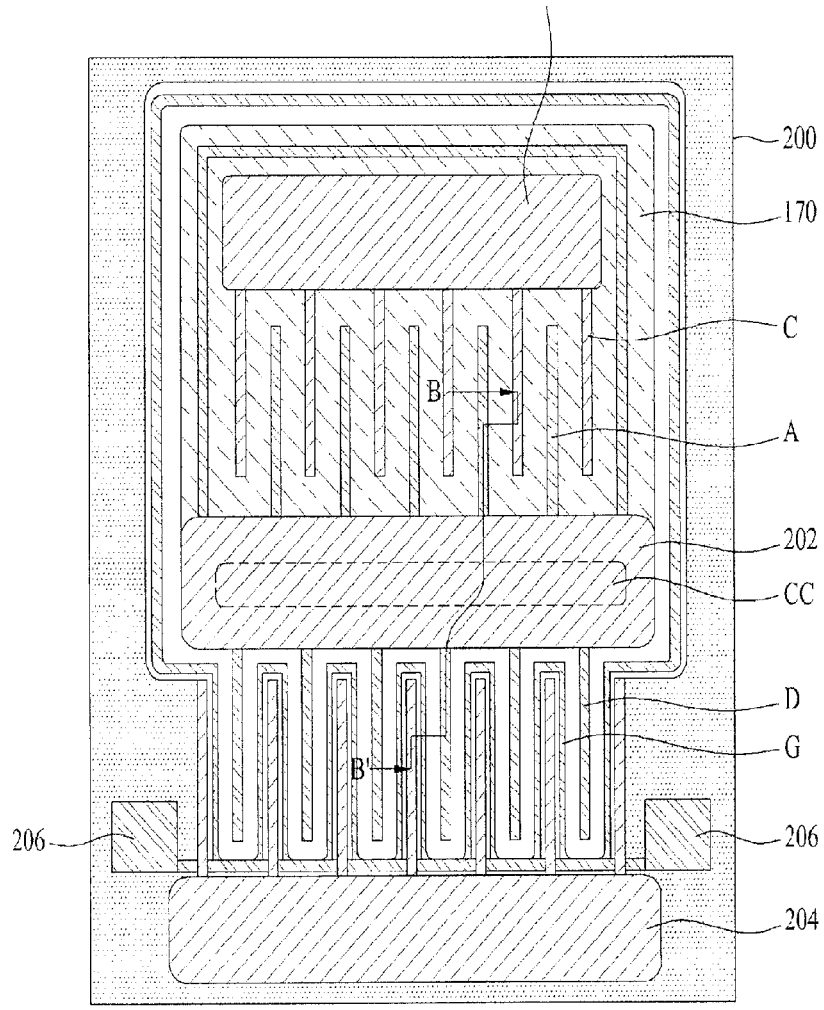

[Fig. 14a]
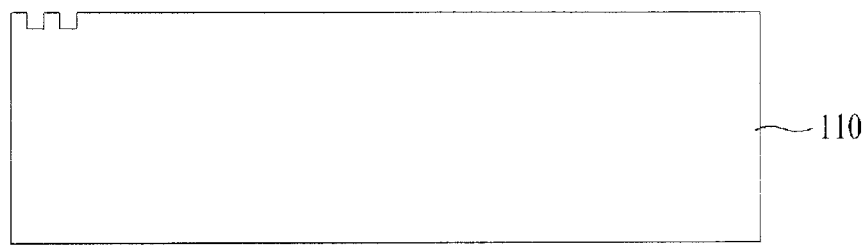
[Fig. 14b]
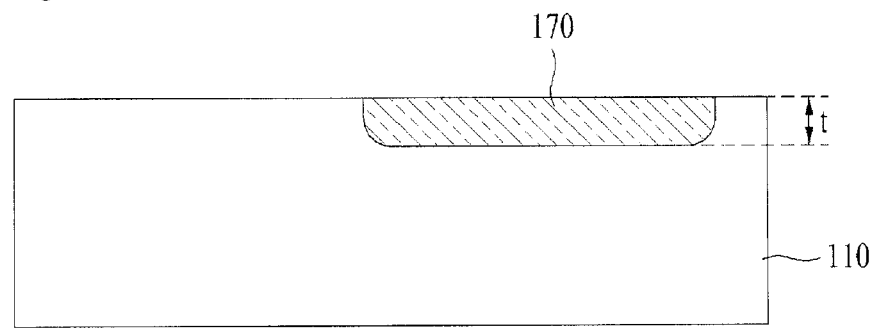
[Fig. 14c]
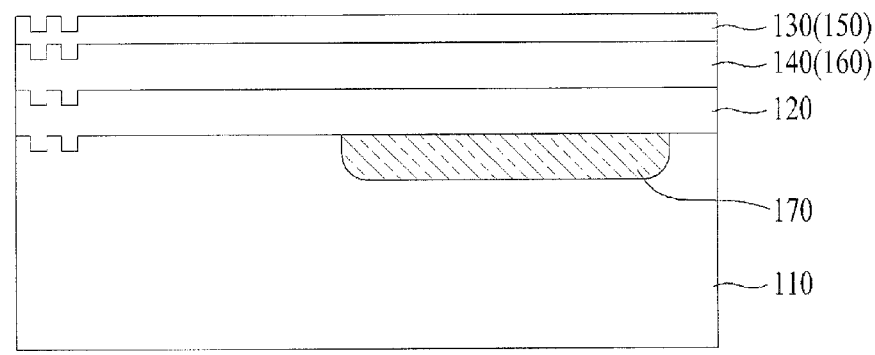
[Fig. 14d]
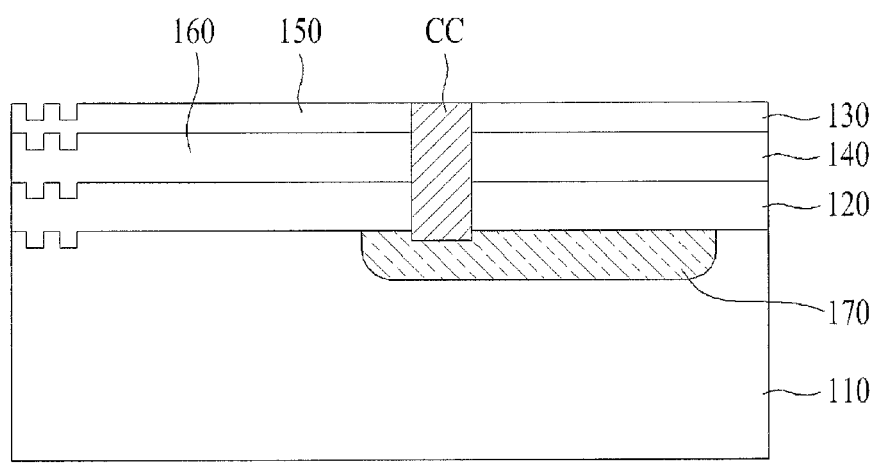

[Fig. 14e]
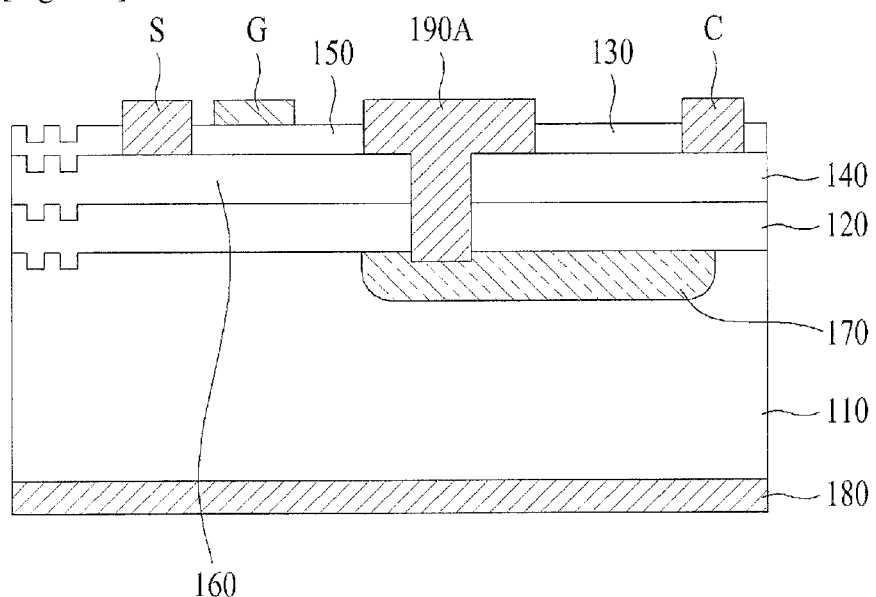
[Fig. 15]
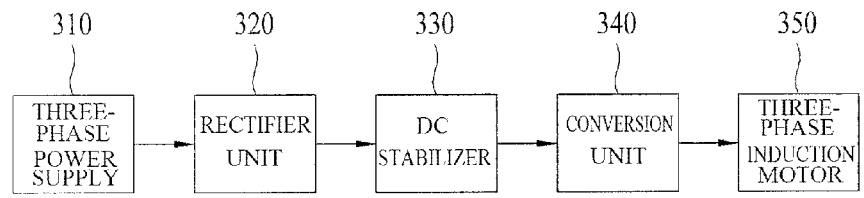

SEMICONDUCTOR DEVICE AND SEMICONDUCTOR CIRCUIT INCLUDING THE DEVICE

CROSS-REFERENCE TO RELATED PATENT APPLICATIONS

This application is a U.S. National Stage Application under 35 U.S.C. § 371 of PCT Application No. PCT/KR2014/000520, filed Jan. 17, 2014, which claims priority to Korean Patent Application No. 10-2013-0148331, filed Dec. 2, 2013, whose entire disclosures are hereby incorporated by reference.

TECHNICAL FIELD

Embodiments related to a semiconductor device and a semiconductor circuit including the same.

BACKGROUND ART

Plural GaN power devices such as Heterostructure Field Effect Transistors (HFETs) and Schottky diodes can be monolithically integrated.

FIG. 1 illustrates a conventional semiconductor circuit. Referring to FIG. 1, the semi-conductor circuit includes an inductor L1, a HFET Q, a Schottky diode D1, and a capacitor C1. A resistor R1, representing the output load, is also shown.

FIG. 2 is a graph showing current-voltage characteristics of the Schottky diode D1 illustrated in FIG. 1. In FIG. 2, a horizontal axis denotes a forward voltage of the Schottky diode D1, and a vertical axis denotes a forward current of the Schottky diode D1.

The semiconductor circuit of FIG. 1 is embodied as a sort of boost converter circuit. Referring to FIG. 1, the HFET Q is turned on in response to a bias voltage BV1 applied to a gate thereof. When an input voltage VI is applied via the inductor L1 in a state in which the HFET Q is turned on, a voltage drop between an anode of the Schottky diode D1 and a reference potential may be approximately 1 V and an output voltage VO may be approximately 400 V. In this case, the cathode of the Schottky diode D1 has a greater voltage than that of the anode thereof and thus the Schottky diode D1 is turned off due to a reverse bias. When the HFET Q is turned off, however, the voltage drop between an anode of the Schottky diode D1 and a reference potential is greater than the output voltage VO and thus the Schottky diode D1 is turned on. As such, the semiconductor circuit of FIG. 1 can boost the input voltage VI to a desired level of output voltage VO.

When the HFET Q is turned off and the Schottky diode D1 is turned on, a back-gate phenomenon whereby a drift layer (or a channel layer) of the Schottky diode D1 is partially depleted due to an electric field caused by a difference in potential between the drift layer of the Schottky diode D1 and a substrate (not shown) occurs. Due to the back-gate phenomenon, as illustrated in FIG. 2, the resistance of the Schottky diode D1 exceeds a normal value (plot 10) and increases in the direction indicated by an arrow (plot 20).

DISCLOSURE OF INVENTION

Technical Problem

Embodiments provide a semiconductor device with enhanced current-voltage characteristics in spite of a back-gate phenomenon and a semiconductor circuit including the same.

Solution to Problem

According to an embodiment of the disclosure, a semiconductor device includes a second conductive type substrate including a first first-conductive-type doping layer and a plurality of devices on the second conductive type substrate, wherein a first device of the devices includes a first nitride semiconductor layer on the first first-conductive-type doping layer, a second nitride semiconductor layer brought together with the first nitride semiconductor layer to form a first heterojunction interface, between the first first-conductive-type doping layer and the first nitride semiconductor layer, a first contact electrically connected to the first heterojunction interface, and a contact connector electrically connecting the first contact to the first first-conductive-type doping layer.

A second device of the devices may include a third nitride semiconductor layer on the second conductive type substrate, a fourth nitride semiconductor layer brought together with the third nitride semiconductor layer to form a second heterojunction interface, between the second conductive type substrate and the third nitride semiconductor layer, and a second contact electrically connected to the second heterojunction interface.

The second conductive type substrate may further include a second first-conductive-type doping layer disposed so as to surround edges of the first first-conductive-type doping layer and having a lower doping concentration than that of the first first-conductive-type doping layer.

The third nitride semiconductor layer and the first nitride semiconductor layer may be integrally formed, and the fourth nitride semiconductor layer and the second nitride semiconductor layer may be integrally formed.

The semiconductor device may further include a device connection part electrically connecting the first contact to the second contact.

At least a portion of the device connection part, the contact connector, the first contact, or the second contact may be integrally formed.

The first and second nitride semiconductor layers may include different components.

The first and second nitride semiconductor layers may include the same components, in which the contents of the components in the first and second nitride semiconductor layers may differ from each other.

Each of the first and second devices may include a Schottky diode or a Heterostructure Field Effect Transistor.

The first contact may include a cathode disposed on the first nitride semiconductor layer and electrically connected to the first heterojunction interface and an anode electrically connected to the contact connector, the first heterojunction interface, and the device connection part. The second contact may include a drain contact electrically connected to a first side of the second heterojunction interface and the device connection part, a source contact electrically connected to a second side of the second heterojunction interface, and a gate electrode on the third nitride semiconductor layer, between the drain contact and the source contact. At least a portion of the anode, the contact connector, the device connection part, or the drain contact may be integrally formed. The first device may have a plane shape surrounded by the gate electrode.

The first contact may include a first drain contact electrically connected to a first side of the first heterojunction interface, a first source contact electrically connected to a second side of the first heterojunction interface, the contact connector, and the device connection part, and a first gate electrode disposed on the first nitride semiconductor layer, between the first drain contact and the first source contact.

The second contact may include an anode electrically connected to a first side of the second heterojunction interface and a cathode electrically connected to a second side of the second heterojunction interface and the device connection part. At least a portion of the first source contact, the contact connector, the device connection part, or the cathode may be integrally formed.

The second contact may include a second source contact electrically connected to a first side of the second heterojunction interface, a second drain contact electrically connected to a second side of the second heterojunction interface and the device connection part, and a second gate electrode disposed on the third nitride semiconductor layer, between the second source contact and the second drain contact. At least a portion of the first source contact, the device connection part, the contact connector, or the second drain contact may be integrally formed.

The contact connector may include a first part connected to the first contact and a second part extending from the first part to an inside of the first first-conductive-type doping layer. A first distance between a side wall of the second part and a side wall of the first first-conductive-type doping layer may be greater than a second distance between a bottom surface of the second part and a bottom surface of the first first-conductive-type doping layer.

The contact connector may pass through the first and second nitride semiconductor layers in an inclined form.

The first first-conductive-type doping layer may have a concentration gradient in a depth direction of the second conductive type substrate.

A thickness t and a sheet doping density Ns of the first first-conductive-type doping layer may satisfy the conditions shown in the following equation:

$$N_S = \int_0^t N_d(z)\,dz$$

wherein $N_d(z)$ denotes a doping concentration of the first first-conductive-type doping layer and z denotes a length in a depth direction of the first first-conductive-type doping layer.

A sheet doping density Ns of the first first-conductive-type doping layer may satisfy the conditions shown in the following equation:

$$N_s > \sqrt{\frac{2\varepsilon V N_a}{q}}$$

wherein $\varepsilon$ denotes a permittivity of the first first-conductive-type doping layer, V denotes a maximum reverse bias voltage across the first device, Na denotes a doping concentration of the second conductive type substrate, and q denotes the electronic charge.

The doping concentration Na of the second conductive type substrate may be between $1\times10^{13}$ /cm$^3$ and $5\times10^{14}$/cm$^3$, and the sheet doping density Ns of the first first-conductive-type doping layer may be greater than $2.7\times10^{11}$/cm$^2$.

The second conductive type substrate may include a conductive material.

The semiconductor device may further include a metal layer disposed on a rear surface of the second conductive type substrate to face the first and second devices.

The first first-conductive-type doping layer may have a width that is equal to or greater than that of the first heterojunction interface.

According to another embodiment of the disclosure, a semiconductor device includes a substrate, first and second devices on the substrate, and a device connection part electrically connecting the first device to the second device, wherein the substrate includes a first doping layer having a conductive type different from that of the substrate, the first device includes a first channel layer disposed on the substrate and facing the first doping layer, a first contact electrically connected to the first channel layer, and a contact connector electrically connecting the first doping layer to the first contact, and the second device includes a second channel layer and a second contact electrically connected to the second channel layer and electrically connected to the first contact via the device connection part.

The substrate may further include a second doping layer disposed so as to surround edges of the first doping layer, having the same conductive type as that of the first doping layer, and having a lower doping concentration than that of the first doping layer.

According to another embodiment of the disclosure, a semiconductor circuit includes the semiconductor device described above and a passive element connected to the semiconductor device.

The passive element may include an inductor having a first terminal connected to an input voltage and a second terminal connected to the device connection part and a capacitor connected to an output voltage, the first device may be connected between the device connection part and the output voltage, and the second device may be connected between the device connection part and the reference potential. The first and second devices may be alternately turned on in response to a bias voltage.

The passive element may include an inductor connected between the device connection part and the output voltage and a capacitor connected to the output voltage, the first device may be connected between the input voltage and the device connection part, and the second device may be connected between the device connection part and the reference potential.

Advantageous Effects of Invention

In semiconductor devices according to embodiments and a semiconductor circuit including one of the semiconductor devices, a first first-conductive-type doping layer is disposed between a second conductive type substrate and a first channel layer of a first device of a plurality of devices disposed on the second conductive type substrate and thus prevents the first channel layer from being affected by an electric field caused between the first channel layer and the second conductive type substrate, whereby the first device has enhanced voltage/current characteristics. Namely, an increase in resistance of the first device may be prevented.

In addition, a second first-conductive-type doping layer is disposed so as to surround edges of the first first-conductive-type doping layer and thus an electric field concentrating on the edges of the first first-conductive-type doping layer may be reduced through dispersion, whereby a high breakdown voltage may be provided and leakage current may be reduced.

BRIEF DESCRIPTION OF DRAWINGS

Arrangements and embodiments may be described in detail with reference to the following drawings in which like reference numerals refer to like elements and wherein:

FIG. 1 illustrates a conventional semiconductor circuit;

FIG. 2 is a graph showing current-voltage characteristics of a Schottky diode illustrated in FIG. 1;

FIG. 3 is a sectional view of a semiconductor device according to an embodiment;

FIG. 4 is an enlarged sectional view of portion "A" illustrated in FIG. 3;

FIG. 5 is a sectional view of a semiconductor device according to another embodiment;

FIG. 6 is a sectional view of a semiconductor device according to still another embodiment;

FIG. 7 is a sectional view of a semiconductor device according to still another embodiment;

FIG. 8 is a circuit diagram of a semiconductor circuit including the semiconductor device of FIG. 6 or 7, according to another embodiment;

FIG. 9 is a sectional view of a semiconductor device according to still another embodiment;

FIG. 10 is a sectional view of a semiconductor device according to still another embodiment;

FIG. 11 is a circuit diagram of a semiconductor circuit including the semiconductor device of FIG. 9 or 10, according to still another embodiment;

FIG. 12 is a sectional view of a semiconductor device according to still another embodiment;

FIG. 13 is a plan view of the semiconductor device of FIG. 3 or 5;

FIGS. 14a to 14e are sectional views sequentially illustrating a method of manufacturing the semiconductor device of FIG. 5; and FIG. 15 is a block diagram of a three-phase induction motor driving device according to an embodiment.

BEST MODE FOR CARRYING OUT THE INVENTION

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

Also, spatially relative terms, such as "first" or "second" and "upper" or "lower," may be used herein only to distinguish one entity or element from another entity or element without necessarily requiring or implying physical or logical relationship or order between such entities or elements.

In the drawings, the thickness or size of each layer is exaggerated, omitted, or schematically illustrated for convenience of description and clarity. In addition, the size of each element does not entirely reflect the actual size thereof.

FIG. 3 is a sectional view of a semiconductor device 100A according to an embodiment.

Referring to FIG. 3, the semiconductor device 100A includes a substrate 110, a plurality of devices (e.g., first and second devices D1A and D2A), and a device connection part (or interconnection part) DC.

The substrate 110 may include a conductive material. For example, the substrate 110 may be a silicon substrate, a silicon carbide substrate, or a GaN substrate, but type of the substrate 110 is not limited to the above-described examples. For example, the substrate 110 may be a silicon substrate having a (111) crystal face as a principal plane and have a thickness of 100 μm to 200 μm.

According to an embodiment, the substrate 110 includes a first first-conductive-type doping layer 170. The first first-conductive-type doping layer 170 may be doped with a first conductive type dopant. For example, when the substrate 110 is p-type Si, the first first-conductive-type doping layer 170 is a first n-type doping layer and the first conductive type dopant may include an n-type dopant such as P, As, or the like. In this regard, the substrate 110 may be of a second conductive type that is different from the conductive type of the first first-conductive-type doping layer 170. The substrate 110 may be doped with a second conductive type dopant. For example, when the substrate 110 is of a p-type, the second conductive type dopant may be a p-type dopant such as B, or the like.

The first first-conductive-type doping layer 170 may have a concentration gradient in a depth direction of the second conductive type substrate 110. For example, a doping concentration of the first first-conductive-type doping layer 170 may decrease towards a second location z2 from a first location z1.

A thickness t and a sheet doping density Ns of the first first-conductive-type doping layer 170 may satisfy the conditions shown in Equation 1 below.

$$N_S = \int_0^t N_d(z)\,dz \quad \text{[Equation 1]}$$

In Equation 1, $N_d(z)$ denotes a doping concentration of the first first-conductive-type doping layer 170, and z denotes a length in a depth direction of the first first-conductive-type doping layer 170. Namely, z is 0 at the first location z1 and z increases with approaching the second location z1.

In addition, the sheet doping density Ns of the first first-conductive-type doping layer 170 may satisfy the conditions shown in Equation 2 below.

$$N_s > \sqrt{\frac{2\varepsilon V N_a}{q}}$$

In Equation 2, ε denotes a permittivity of the first first-conductive-type doping layer 170, V denotes a maximum reverse bias voltage dropped across the first device D1A, Na denotes a doping concentration of the second conductive type substrate 110, and q denotes the electronic charge.

When the doping concentration Na of the second conductive type substrate 110 is too small, its resistivity becomes too high. When the doping concentration Na of the second conductive type substrate 110 is too great, the semiconductor device 100A cannot withstand high avalanche breakdown voltage. Thus, the doping concentration Na of the second conductive type substrate 110 may for example be between $1\times10^{13}/cm^3$ and $5\times10^{14}/cm^3$, but embodiments are not limited thereto. In addition, the sheet doping density Ns of the first first-conductive-type doping layer 170 must be high enough to prevent punch-through breakdown at the maximum operation voltage of the first device D1A. Thus, the sheet doping density Ns of the first first-conductive-type doping layer 170 may be greater than $2.7\times10^{11}/cm^3$.

In addition, a buffer layer 120 may be disposed on the second conductive type substrate 110. The buffer layer 120 relieves strain caused due to a difference in lattice constant between a nitride constituting the devices, e.g., the first and second devices D1A and D2A, which are disposed on the second conductive type substrate 110, and the second conductive type substrate 110 and prevents effects by impurities contained in the second conductive type substrate 110. For this operation, the buffer layer 120 may include at least one of AlN, GaN, SiC, or AlGaN. For example, the buffer layer 120 may have a structure including two layers formed of AlN/AlGaN. When the buffer layer 120 has a critical thickness or greater, diffusion of silicon atoms from the second conductive type substrate 110 may be prevented and thus occurrence of melt-back may be prevented. For this operation, the buffer layer 120 may have a thickness of tens to hundreds of nanometers, for example, 100 nm to less than 300 nm. In some embodiments, the buffer layer 120 may be omitted.

The second conductive type substrate 110 and the buffer layer 120 are parts shared by the devices. Each of the devices capable of being electrically connected to each other may include, for example, a Schottky diode or a Heterostructure Field Effect Transistor (HFET), but embodiments are not limited thereto.

Although FIG. 3 illustrates two devices, i.e., the first and second devices D1A and D2A, disposed on the second conductive type substrate 110 in a horizontal direction, the number and disposition of devices are not limited to the above-described example.

One of the devices, i.e., the first device D1A, includes first and second nitride semiconductor layers 130 and 140, a first contact, and a contact connector CC.

The first nitride semiconductor layer 130 is disposed on the first first-conductive-type doping layer 170. Namely, the first nitride semiconductor layer 130 is disposed with facing the first first-conductive-type doping layer 170.

The second nitride semiconductor layer 140 is disposed between the first first-conductive-type doping layer 170 and is brought together with the first nitride semiconductor layer 130 to form a first heterojunction interface HJ1. As such, the first and second nitride semiconductor layers 130 and 140 may be formed of a material appropriate for heterojunction therebetween.

Each of the first and second nitride semiconductor layers 130 and 140 may include a Group III element-containing nitride. For example, each of the first and second nitride semiconductor layers 130 and 140 may include at least one of GaN, AlN, or InN or an alloy thereof, but embodiments are not limited thereto. Namely, the materials of the first and second nitride semiconductor layers 130 and 140 are not limited to the above-described examples so long as the first and second nitride semiconductor layers 130 and 140 form a first channel layer CH1 (or a first drift layer) through heterojunction therebetween.

In addition, according to one embodiment, the first and second nitride semiconductor layers 130 and 140 may include different components. For example, the first nitride semiconductor layer 130 may include AlGaN and the second nitride semiconductor layer 140 may include GaN. In this regard, GaN included in the second nitride semiconductor layer 140 may be undoped.

According to another embodiment, the first and second nitride semiconductor layers 130 and 140 may include the same components, in which the contents of the components of the first and second nitride semiconductor layers 130 and 140 may differ from each other. For example, each of the first and second nitride semiconductor layers 130 and 140 may include $Al_XGa_{1-X}N$. In this case, an Al content (X=X1) of AlGaN included in the first nitride semiconductor layer 130 may be greater than an Al content (X=X2) of AlGaN included in the second nitride semiconductor layer 140. For example, X1 may be 0.25 and X2 may be 0.05, but embodiments are not limited to the above-described amounts.

Meanwhile, the first contact is a portion electrically connected to the first heterojunction interface HJ1. As such, in a case in which the first contact is electrically connected to the first heterojunction interface HJ1, when the first channel layer CH1 is formed below the first heterojunction interface HJ1, the first contact may be electrically connected to the first channel layer CH1.

According to one embodiment, as illustrated in FIG. 3, the first contact may include a cathode C and an anode A. The cathode C and the anode A may be electrically connected respectively to opposite sides of the first heterojunction interface HJ1. Thus, when the first channel layer CH1 is formed at an upper surface of the second nitride semiconductor layer 140 below the first heterojunction interface HJ1, the cathode C and the anode A may be electrically connected respectively to opposite sides of the first channel layer CH1.

As illustrated in FIG. 3, the cathode C may directly contact the first heterojunction interface HJ1. In another embodiment, however, the cathode C may be disposed on the first nitride semiconductor layer 130. Namely, the cathode C need not be directly connected to the first heterojunction interface HJ1 so long as the cathode C is electrically connected to the first heterojunction interface HJ1.

The anode A is also electrically connected to the contact connector CC and the device connection part DC in addition to the first heterojunction interface HJ1.

The anode A may be in Schottky contact with the first and second nitride semiconductor layers 130 and 140, and the cathode C may be in ohmic contact with at least one of the first or second nitride semiconductor layers 130 or 140.

The contact connector CC electrically connects the first contact to the first first-conductive-type doping layer 170. As illustrated in FIG. 3, the contact connector CC electrically connects the anode A of the first device D1A to the first first-conductive-type doping layer 170. The contact connector CC may include a material with electrical conductivity and may be formed as a single layer or multiple layers including at least one of Cr, Ti, Al, W, Ni, Pt, or Au.

FIG. 4 is an enlarged sectional view of portion "A" illustrated in FIG. 3.

Referring to FIGS. 3 and 4, the contact connector CC may include a first part CCA and a second part CCB. The first part CCA is a portion connected to the first contact and may have a shape penetrating the first and second nitride semiconductor layers 130 and 140. For example, the first part CCA may be electrically connected to the anode A of the first contact. The second part CCB is formed so as to extend from a bottom surface CCA-1 of the first part CCA to the inside of the first first-conductive-type doping layer 170. Although FIGS. 3 and 4 illustrate the contact connector CC as including both the first part CCA and the second part CCB, the second part CCB may be omitted. When the second part CCB is omitted, the bottom surface CCA-1 of the first part CCA of the contact connector CC may electrically contact the first first-conductive-type doping layer 170.

In addition, according to an embodiment, a first distance D1 between a side wall CCB-1 of the second part CCB and a side wall 170-1 of the first first-conductive-type doping layer 170 may be greater than a second distance D2 between a bottom surface CCB-2 of the second part CCB and a bottom surface 170-2 of the first first-conductive-type doping layer 170. As such, in a case in which the first distance D1 is greater than the second distance D2, when the second conductive type substrate 110 and the first first-conductive-type doping layer 170 are reverse-biased, a depletion region therebetween may be stably formed. For example, the second distance D2 may be 0.5 μm or greater, but embodiments are not limited to particular values.

In addition, the contact connector CC illustrated in FIGS. 3 and 4 vertically extends from the anode A to the first first-conductive-type doping layer 170 with passing through the first and second nitride semiconductor layers 130 and 140 in a first direction. According to another embodiment, unlike what is illustrated in FIGS. 3 and 4, the contact connector CC may pass through the first and second nitride semiconductor layers 130 and 140 in an inclined form, not in a vertical form. The shape of the contact connector CC is not limited to the above-described examples so long as the contact connector CC electrically connects the first contact to the first first-conductive-type doping layer 170.

Meanwhile, referring to FIG. 3, another of the devices, i.e., the second device D2A, may include a third nitride semiconductor layer 150, a fourth nitride semiconductor layer 160, and a second contact.

The third nitride semiconductor layer 150 is disposed on the second conductive type substrate 110. The third nitride semiconductor layer 150 and the first nitride semiconductor layer 130 may be integrally formed, but embodiments are not limited thereto.

The fourth nitride semiconductor layer 160 is disposed between the second conductive type substrate 110 and the third nitride semiconductor layer 150. The fourth nitride semiconductor layer 160 and the second nitride semiconductor layer 140 may be integrally formed, but embodiments are not limited thereto.

The third nitride semiconductor layer 150 is bought together with the fourth nitride semiconductor layer 160 to form a second heterojunction interface HJ2. As such, the third and fourth nitride semiconductor layers 150 and 160 may be formed of a material appropriate for heterojunction therebetween.

Each of the third and fourth nitride semiconductor layers 150 and 160 may include a Group III element-containing nitride. For example, each of the third and fourth nitride semiconductor layers 150 and 160 may include at least one of GaN, AN, or InN or an alloy thereof, but embodiments are not limited thereto.

As in the first and second nitride semiconductor layers 130 and 140, materials of the third and fourth nitride semiconductor layers 150 and 160 are not limited to the above-described examples so long as the third and fourth nitride semiconductor layers 150 and 160 form a second channel layer CH2 (or a second drift layer) through heterojunction therebetween.

In addition, according to one embodiment, the third and fourth nitride semiconductor layers 150 and 160 may include different components. For example, the third nitride semiconductor layer 150 may include AlGaN and the fourth nitride semiconductor layer 160 may include GaN. In this regard, GaN included in the fourth nitride semiconductor layer 160 may be undoped.

According to another embodiment, the third and fourth nitride semiconductor layers 150 and 160 may include the same components, in which the contents of the components of the third and fourth nitride semiconductor layers 150 and 160 may differ from each other. For example, each of the third and fourth nitride semiconductor layers 150 and 160 may include $Al_YGa_{1-Y}N$. In this case, an Al content (Y=Y1) of AlGaN included in the third nitride semiconductor layer 150 may be greater than an Al content (Y=Y2) of AlGaN included in the fourth nitride semiconductor layer 160. For example, Y1 may be 0.25 and Y2 may be 0.05, but embodiments are not limited to the above-described amounts.

The second contact is a portion electrically connected to the second heterojunction interface HJ2. Thus, when the second channel layer CH2 is formed at an upper surface of the fourth nitride semiconductor layer 160 below the second heterojunction interface HJ2, the second contact may be electrically connected to the second channel layer CH2.

According to one embodiment, the second contact may include a gate electrode G, a drain contact D, and a source contact S. The drain contact D is electrically connected to a first side of the second heterojunction interface HJ2. Thus, when the second channel layer CH2 is formed at the upper surface of the fourth nitride semiconductor layer 160 below the second heterojunction interface HJ2, the drain contact D may be electrically connected to a first side of the second channel layer CH2. In addition, the drain contact D is also electrically connected to the device connection part DC.

The source contact S is connected to a second side of the second heterojunction interface HJ2. Thus, when the second channel layer CH2 is formed, the source contact S may be electrically connected to a second side of the second channel layer CH2. As illustrated in FIG. 3, the source contact S may directly contact the second heterojunction interface HJ2. According to another embodiment, the source contact S may be disposed on the third nitride semiconductor layer 150. Namely, the source contact S need not be directly connected to the second heterojunction interface HJ2 so long as the source contact S is electrically connected to the second heterojunction interface HJ2.

The gate electrode G is disposed on the third nitride semiconductor layer 150, between the drain contact D and the source contact S. Although not shown, the second device D2A may further include a gate insulating layer between the gate electrode G and the third nitride semiconductor layer 150, but embodiments are not limited thereto. Namely, the gate insulating layer may be omitted.

The device connection part DC electrically connects the first contact to the second contact. Referring to FIG. 3, the device connection part DC electrically connects the anode A of the first contact to the drain contact D of the second contact.

The device connection part DC may include a material with electrical conductivity and may be formed as a single layer or multiple layers including at least one of Cr, Ti, Al, W, Ni, Pt, or Au.

At least a portion of the device connection part DC, the contact connector CC, the first contact, or the second contact may be integrally formed or separately formed.

FIG. 5 is a sectional view of a semiconductor device 100B according to another embodiment.

In the semiconductor device 100A of FIG. 3, the anode A of the first contact, the device connection part DC, the drain contact D of the second contact, and the contact connector CC may be separately formed, but embodiments are not limited thereto. Namely, at least a portion of the anode A, the device connection part DC, the drain contact D, or the contact connector CC may be integrally formed. For example, as illustrated in FIG. 5, the anode A, the contact connector CC, the device connection part DC, and the drain contact D may be formed as an integration layer 190A. Except for this difference, the semiconductor device 100B of FIG. 5 includes the same elements as those of the semiconductor device 100A of FIG. 3 and thus a detailed description thereof will be omitted herein.

In addition, the semiconductor devices 100A and 100B according to the embodiments may further include a metal layer 180. The metal layer 180 is disposed on a rear surface of the second conductive type substrate 110 to face the first device D1A and the second device D2A. The metal layer 180 may be formed of the same or different materials as that of the device connection part DC. For example, the metal layer 180 may include a material with electrical conductivity and may be formed as a single layer or multiple layers including, for example, at least one of Cr, Ni, Pt, Ti, or Au.

According to one embodiment, as illustrated in FIGS. 3 and 5, the first device D1A of the semiconductor device 100A or 100B may include a Schottky diode and the second device D2A thereof may include a Heterostructure Field Effect Transistor (HFET). In this case, the semiconductor device 100A of FIG. 3 and the semiconductor device 100B of FIG. 5 may be applied to the boost converter circuit illustrated in FIG. 1, but embodiments are not limited thereto. Namely, the semiconductor devices 100A and 100B may also be connected to passive elements in various other forms different from connection between the semiconductor device and the passive elements (e.g., an inductor L1 and a capacitor C1) of FIG. 1 according to applications thereof.

The semiconductor circuit of FIG. 1 includes, as passive elements, the inductor L1 and the capacitor C1. A resistor representing the output load is also shown. The inductor L1 has a first terminal connected to an input voltage VI and a second terminal connected to the device connection part DC. The capacitor C1 is connected to the output voltage VO. The capacitor is connected in parallel with the output load between an output voltage VO and a reference potential. The Schottky diode D1 as the first device D1A is connected between the second terminal of the inductor L1 and the output voltage VO, and the HFET Q as the second device D2A is connected between the second terminal of the inductor L1 and the reference potential.

Hereinafter, operations of the semiconductor devices 100A and 100B of FIGS. 3 and 5 will be described with reference to FIG. 1 for easier understanding of embodiments, but embodiments are not limited thereto. In this case, a first node N1A illustrated in FIGS. 3 and 5 is connected to the output voltage VO, a second node N2A of FIGS. 3 and 5 is connected to a contact point P1 between the inductor L and the HFET Q, a first bias voltage BV1 is applied to a third node N3A of FIGS. 3 and 5, and each of fourth and fifth nodes N4A and N5A of FIGS. 3 and 5 is connected to the reference potential, i.e., ground.

When a high level of first bias voltage BV1 is applied via the third node N3A, the second channel layer CH2 is formed and thus the HFET Q as the second device D2A is turned on. For this operation, the drain contact D and the source contact S are electrically connected to the second channel layer CH2. When the third and fourth nitride semiconductor layers 150 and 160 having different lattice constants form the second heterojunction interface HJ2, positive polarization charge such as spontaneous polarization and piezoelectric polarization charge is caused, and thus, a two-dimensional electron gas (2-DEG) layer corresponding to the second channel layer CH2 of the second device D2A may be formed at the upper surface of the fourth nitride semiconductor layer 160 below the second heterojunction interface HJ2. Namely, the second channel layer CH2 may be formed when the high level of first bias voltage BV1 is applied to the gate electrode G and the third and fourth nitride semiconductor layers 150 and 160 form a heterojunction.

In a state in which the second channel layer CH2 is formed, a voltage of the contact point P1 of the anode A of the Schottky diode D1 as the first device D1A is 1 V and the output voltage VO of the cathode C is greater than 1 V, e.g., 400 V and thus the Schottky diode D1 as the first device D1A is reverse-biased and thus the first channel layer CH1 is not formed, which turns the Schottky diode D1 off.

When a low level of first bias voltage BV1 is applied via the third node N3A, however, the second channel layer CH2 is depleted and thus the HFET Q as the second device D2A is turned off. In this case, a first voltage of the anode A of the Schottky diode D1 as the first device D1A is greater than a second voltage of the cathode C thereof. For example, the first voltage may be 401 V and the second voltage may be 400 V. Thus, the Schottky diode D1 as the first device D1A is forward-biased and thus the first channel layer CH1 is formed, which turns the Schottky diode D1 on. When the first and second nitride semiconductor layers 130 and 140 having different lattice constants form the first heterojunction interface HJ1, spontaneous polarization and piezoelectric polarization charges are caused and thus a two-dimensional electron gas (2-DEG) layer corresponding to the first channel layer CH1 of the first device D1 or D1A may be formed at the upper surface of the second nitride semiconductor layer 140 below the first heterojunction interface HJ1.

When the first device D1 or D1A is turned on, as a back-gate phenomenon, an electric field may be caused due to difference in potential between the first channel layer CH1 and the second conductive type substrate 110. However, according to an embodiment, the first first-conductive-type doping layer 170 is disposed between the first channel layer CH1 and the second conductive type substrate 110 and thus an electric field is blocked, whereby partial depletion of the first channel layer CH1 due to the electric field may be prevented. Namely, by disposing the first first-conductive-type doping layer 170 between the second conductive type substrate 110 and the first channel layer CH1, an electric field EF1 is present only inside the second conductive-type substrate 110 as represented by arrows in FIGS. 3 and 5, not in the buffer layer 120 and the second nitride semiconductor layer 140. As such, the first first-conductive-type doping layer 170 prevents the first channel layer CH1 from being affected by the back-gate phenomenon. To satisfactorily implement this operation, a first width W1 of the first first-conductive-type doping layer 170 may be equal to or greater than a second width W2 of the first heterojunction interface HJ1, i.e., the first channel layer CH1.

When a potential of the first device DA1 is high, the first first-conductive-type doping layer 170 and the second conductive type substrate 110 are reverse-biased within the second conductive type substrate 110 and thus leakage current of the second conductive type substrate 110 is reduced.

As described above, in the semiconductor circuit of FIG. 1 including the semiconductor device 100A or 100B, the first device D1 or D1A and the second device Q or D2A may be alternately turned on according to level of the applied first bias voltage BV1.

FIG. 6 is a sectional view of a semiconductor device 100C according to still another embodiment.

As illustrated in FIG. 6, a first device D1B may include a first HFET and the second device D2A may include a second HFET. The semiconductor device 100C of FIG. 6 includes the same elements as those of the semiconductor device 100A of FIG. 3, except that types and shapes of the first and second contacts differ, and thus a detailed description thereof will be omitted herein.

Referring to FIG. 6, the first contact includes a first gate electrode G1, a first drain contact D1, a first source contact S1, and a contact connector CC.

The first drain contact D1 is electrically connected to a first side of the first heterojunction interface HJ1. Thus, when the first channel layer CH1 is formed below the first heterojunction interface HJ1, the first drain contact D1 may be electrically connected to the first channel layer CH1. In this regard, as illustrated in FIG. 6, the first drain contact D1 may be directly connected to the first heterojunction interface HJ1. According to another embodiment, the first drain contact D1 may be disposed on the first nitride semiconductor layer 130. Namely, the first drain contact D1 need not be directly connected to the first heterojunction interface HJ1 so long as the first drain contact D1 is electrically connected to the first heterojunction interface HJ1.

The first source contact S1 is connected to a second side of the first heterojunction interface HJ1. Thus, when the first channel layer CH1 is formed below the first heterojunction interface HJ1, the first source contact S1 may be electrically connected to a second side of the first channel layer CH1. In addition, the first source contact S1 is also electrically connected to the contact connector CC and the device connection part DC.

The first gate electrode G1 is disposed on the first nitride semiconductor layer 130, between the first drain contact D1 and the first source contact S1.

In addition, the second contact illustrated in FIG. 6 includes a second gate electrode G2, a second source contact S2, and a second drain contact D2.

The second source contact S2 is electrically connected to a first side of the second heterojunction interface HJ2. Thus, when the second channel layer CH2 is formed below the second heterojunction interface HJ2, the second source contact S2 may be electrically connected to a first side of the second channel layer CH2. In this regard, as illustrated in FIG. 6, the second source contact S2 may be directly connected to the second heterojunction interface HJ2. According to another embodiment, the second source contact S2 may be disposed on the third nitride semiconductor layer 150 instead of penetrating the third nitride semiconductor layer 150. Namely, the second source contact S2 need not be directly connected to the second heterojunction interface HJ2 so long as the second source contact S2 is electrically connected to the second heterojunction interface HJ2.

The second drain contact D2 is connected to a second side of the second heterojunction interface HJ2. Thus, when the second channel layer CH2 is formed, the second drain contact D2 may be electrically connected to a second side of the second channel layer CH2. In addition, the second drain contact D2 is also electrically connected to the device connection part DC. Namely, the second drain contact D2 may be electrically connected to the first source contact S1 of the first device D1B via the device connection part DC.

The second gate electrode G2 is disposed on the third nitride semiconductor layer 150, between the second source contact S2 and the second drain contact D2.

FIG. 7 is a sectional view of a semiconductor device 100D according to still another embodiment.

In the semiconductor device 100C of FIG. 6, the first source contact S1 and the contact connector CC of the first contact, the device connection part DC, and the second drain contact D2 of the second contact may be separately formed, but embodiments are not limited thereto. Namely, at least a portion of the first source contact S1, the contact connector CC, the device connection part DC, or the second drain contact D2 may be integrally formed. For example, as illustrated in FIG. 7, the first source contact S1, the contact connector CC, the device connection part DC, and the second drain contact D2 may be formed as an integration layer 190B. Except for this difference, the semiconductor device 100D of FIG. 7 includes the same elements as those of the semiconductor device 100C of FIG. 6 and thus a detailed description thereof will be omitted herein.

FIG. 8 is a circuit diagram of a semiconductor circuit including the semiconductor device 100C of FIG. 6 or the semiconductor device 100D of FIG. 7, according to another embodiment.

The semiconductor devices 100C and 100D of FIGS. 6 and 7 may be applied to a semiconductor circuit such as a synchronous buck converter as illustrated in FIG. 8, but embodiments are not limited thereto. Namely, the semiconductor devices 100C and 100D may be coupled to passive elements in various forms according to applications thereof.

Referring to FIG. 8, the semiconductor circuit includes, as passive elements, an inductor L2 and a capacitor C2. A resistor R2 representing the output load is also shown. The inductor L2 is connected between a contact point P2 corresponding to the device connection part DC and an output voltage VO. The capacitor C2 is connected to the output voltage VO. The capacitor C2 is connected in parallel with the output load between the output voltage VO and a reference potential. A first HFET Q1, which is the first device D1B, is connected between an input voltage VI and the contact point P2, which is the device connection part DC. A second HFET Q2 as the second device D2A is connected between the contact point P2 as the device connection part DC and the reference potential.

A first node N1B illustrated in FIGS. 6 and 7 may be connected to the input voltage VI, the first bias voltage BV1 may be applied to a second node N2B of FIGS. 6 and 7, a third node N3B of FIGS. 6 and 7 may be connected to the contact point P2, a second bias voltage BV2 may be applied to a fourth node N4B of FIGS. 6 and 7, and each of fifth and sixth nodes N5B and N6A may be connected to the reference potential, i.e., ground.

The first device D1B (e.g., the first HFET Q1) is turned on in response to the first bias voltage BV1, and the second device D2A (e.g., the second HFET Q2) is turned on in response to the second bias voltage BV2. The first and second devices D1B and D2A (e.g., the first and second HFETs Q1 and Q2) may be alternately turned on.

FIG. 9 is a sectional view of a semiconductor device 100E according to still another embodiment.

As illustrated in FIG. 9, the first device D1B may include an HFET and a second device D2B may include a Schottky diode.

While the second device D2A of the semiconductor device 100C of FIG. 6 includes the second HFET, the second device D2B of the semiconductor device 100E of FIG. 9 includes the Schottky diode. Except for this difference, the semiconductor device 100E of FIG. 9 includes the same elements as those of the semiconductor device 100C of FIG. 6 and thus a detailed description thereof will be omitted herein.

Referring to FIG. 9, the second contact includes the anode A and the cathode C. The anode A is electrically connected to a first side of the second heterojunction interface HJ2. Thus, when the second channel layer CH2 is formed at an upper surface of the fourth nitride semiconductor layer 160 below the second heterojunction interface HJ2, the anode A may be electrically connected to a first side of the second channel layer CH2. In this regard, as illustrated in FIG. 9, the anode A may be directly connected to the second heterojunction interface HJ2. According to another embodiment, the anode A may be disposed on the third nitride semiconductor layer 150. Namely, the anode A need not be directly connected to the second heterojunction interface HJ2 so long as the anode A is electrically connected to the second heterojunction interface HJ2.

The cathode C is connected to a second side of the second heterojunction interface HJ2 by penetrating the third nitride semiconductor layer 150. Thus, when the second channel layer CH2 is formed at the upper surface of the fourth nitride semiconductor layer 160 below the second heterojunction interface HJ2, the cathode C may be electrically connected to a second side of the second channel layer CH2. In addition, the cathode C is electrically connected to the source contact S via the device connection part DC.

FIG. 10 is a sectional view of a semiconductor device 100F according to still another embodiment.

In the semiconductor device 100E of FIG. 9, the source contact S and the contact connector CC of the first contact, the device connection part DC, and the cathode C of the second contact may be separately formed, but embodiments are not limited thereto. Namely, at least a portion of the source contact S, the contact connector CC, the device connection part DC, or the cathode C may be integrally formed. For example, as illustrated in FIG. 10, the source contact S, the contact connector CC, the device connection part DC, and the cathode C may be formed as an integration layer 190C. Except for this difference, the semiconductor device 100F of FIG. 10 includes the same elements as those of the semiconductor device 100E of FIG. 9 and thus a detailed description thereof will be omitted herein.

FIG. 11 is a circuit diagram of a semiconductor circuit including the semiconductor device 100E of FIG. 9 or the semiconductor device 100F of FIG. 10, according to still another embodiment.

The semiconductor devices 100E and 100F of FIGS. 9 and 10 may be applied to a semiconductor circuit such as a buck converter (or a DC stabilizer) as illustrated in FIG. 11, but embodiments of the disclosure are not limited thereto. Namely, the semiconductor devices 100E and 100F may be coupled to passive elements in various forms according to applications thereof.

The semiconductor circuit of FIG. 11 includes the same elements as those of the semiconductor circuit of FIG. 8, except that the semiconductor circuit of FIG. 11 includes a Schottky diode D2 instead of the second HFET Q2 of the semiconductor circuit of FIG. 8, and thus a detailed description thereof will be omitted herein. Namely, connection type of passive elements of the semiconductor circuit of FIG. 11 is the same as that illustrated in FIG. 8. The first HFET Q1 as the first device D1B may be turned on when a high level of first bias voltage BV1 is applied and turned off when a low level thereof is applied, and the Schottky diode D2 as the second device D2B may be turned on when the first HFET Q1 is turned off and turned off when the first HFET Q1 is turned on.

Referring to FIG. 11, a first node N1C illustrated in FIGS. 9 and 10 may be connected to the input voltage VI, the first bias voltage BV1 may be applied to a second node N2C of FIGS. 9 and 10, a third node N3C of FIGS. 9 and 10 may be connected to a contact point P3, and each of fourth and fifth nodes N4C and N5C of FIGS. 9 and 10 may be connected to the reference potential, i.e., ground.

Operations of the semiconductor circuit of FIG. 11 will now be schematically described. When the first HFET Q1 is turned off in response to a low level of first bias voltage BV1, supply of DC input voltage VI is stopped and thus current flows in the resistor R2 and the Schottky diode D2 due to voltage between opposite terminals of the capacitor C2 and energy is accumulated in the inductor L2.

In this regard, when the first HFET Q1 is turned on in response to the high level of first bias voltage BV1, the Schottky diode D2 is turned off, and the DC input voltage VI is recharged in the capacitor C2 via the inductor L2. Simultaneously, current flows towards the resistor R2.

Thus, in the semiconductor circuit illustrated in FIG. 11, turning-off of the first HFET Q1 by the first bias voltage BV1 when an excess amount of voltage is applied to the resistor R2 is controlled, whereby the output voltage VO may be stabilized.

FIG. 12 is a sectional view of a semiconductor device 100G according to still another embodiment.

Referring to FIG. 12, the second conductive type substrate 110 of the semiconductor device 100G may further include a second first-conductive-type doping layer 172. Except for this difference, the semiconductor device 100G of FIG. 12 includes the same elements as those of the semiconductor device 100A of FIG. 3 and thus a detailed description thereof will be omitted herein.

The second first-conductive-type doping layer 172 is disposed so as to surround edges of the first first-conductive-type doping layer 170. In addition, the second first-conductive-type doping layer 172 may have a lower doping concentration than that of the first first-conductive-type doping layer 170. As such, by disposing the second first-conductive-type doping layer 172 on the edges of the first first-conductive-type doping layer 170, the electric field EF2 concentrating on the edges of the first first-conductive-type doping layer 170 may be reduced through dispersion. Due to this configuration, breakdown voltage of the semiconductor device 100G may increase and leakage current thereof may decrease.

Although not shown, as in the semiconductor device 100G of FIG. 12, the semiconductor devices 100B, 100C, 100D, 100E and 100F respectively illustrated in FIGS. 5 to 7, 9 and 10 may also further include the second first-conductive-type doping layer 172 disposed on the edges of the first first-conductive-type doping layer 170.

In the above-described semiconductor devices 100A to 100G, the gate electrodes G, G1 and G2 may include a metal material. For example, the gate electrodes G, G1 and G2 may include a refractory metal or a mixture thereof. In another embodiment, the gate electrodes G, G1 and G2 may be formed as a single layer or multiple layers including at least one of nickel (Ni), gold (Au), platinum (Pt), tantalum (Ta), tantalum nitride (TaN), titanium nitride (TiN), palladium (Pd), tungsten (W), or tungsten silicide ($WSi_2$). For example, the gate electrodes G, G1 and G2 may have a structure including multiple layers formed of Ni/Au or a single layer formed of Pt.

In addition, each of the source and drain contacts S, S1 and S2 and D, D1 and D2 may be formed of a metal. In addition, each of the source and drain contacts S, S1 and S2 and D, D1 and D2 may include the same material as that of the gate electrodes G, G1 and G2. In addition, each of the source and drain contacts S, S1 and S2 and D, D1 and D2 may be formed of a material with ohmic characteristics. For example, each of the source and drain contacts S, S1 and S2 and D, D1 and D2 may be formed as a single layer or multiple layers including at least one of aluminum (Al), Ti, chromium (Cr), Ni, copper (Cu), Au, or molybdenum (Mo). For example, each of the source and drain contacts S, S1 and S2 and D, D1 and D2 may have a structure including multiple layers formed of Ti/Al or Ti/Mo.

In addition, the cathode C may be formed of a metal material with ohmic characteristics. For example, the cathode C may be formed as a single layer or multiple layers including at least one of Al, Ti, Cr, Ni, Cu, or Au. In addition, the anode A may include a metal material. For example, the anode A may include a refractory metal or a mixture thereof. In another embodiment, the anode A may include at least one of Pt, germanium (Ge), Cu, Cr, Ni, Au, Ti, Al, Ta, TaN, TiN, Pd, W, or $WSi_2$.

FIG. 13 is a plan view of the semiconductor device 100A of FIG. 3 or the semiconductor device 100B of FIG. 5.

FIGS. 3 and 5 respectively illustrating the semiconductor devices 100A and 100B correspond to partial sectional views taken along line B-B' of FIG. 13, but embodiments of the disclosure are not limited to the plan view illustrated in FIG. 13.

In the semiconductor device 100A or 100B illustrated in FIG. 13, reference numeral '200' denotes a chip edge in a case in which the semiconductor device 100A or 100B is embodied as a chip. Referring to FIG. 13, each of the semiconductor devices 100A and 100B includes the anode A, the cathode C, the gate electrode G, a drain/anode bonding pad 202, a source bonding pad 204, a gate bonding pad 206, a cathode bonding pad 208, the drain contact D, and the source contact S.

The drain/anode bonding pad 202 is a portion to which the anode A and the drain contact D are electrically connected. The source bonding pad 204 is a portion to which the source contact S is electrically connected. The gate bonding pad 206 is a portion to which the gate electrode G is electrically connected. The cathode bonding pad 208 is a portion to which the cathode C is electrically connected.

Referring to FIG. 13, the first first-conductive-type doping layer 170 is disposed to face the anode A and the cathode bonding pad 208 of the first device D1A. Namely, the first first-conductive-type doping layer 170 is disposed right below the first device D1A, and the contact connector CC extends toward the first first-conductive-type doping layer 170 to be connected thereto.

In addition, the first device D1A may have a plane shape surrounded by the second contact. For example, as illustrated in FIG. 13, the first device D1A may have a plane shape surrounded by the gate electrode G, which is the second contact. As such, when the first device D1A is surrounded by the second contact, flow of leakage current into the second conductive type substrate 110 via an edge 200 may be prevented.

Meanwhile, the beneficial effect of the above-described embodiments may be appreciated if it is assumed that the first devices D1, D1A and D1B of the semiconductor devices 100A to 100G according to the above-described embodiments exclude the first first-conductive-type doping layer 170 and the second first-conductive-type doping layer 172. Under the above assumption, an electron sheet density ns of the first channel layer CH1 may be reduced due to an electric field caused between the first channel layer CH1 and the second conductive type substrate 110 as shown in Equation 3 below.

$$ns = ns_0 - \varepsilon \frac{E}{q} \qquad \text{[Equation 3]}$$
$$= ns_0 - \varepsilon \frac{VO}{qt}$$

In Equation 3, ns0 denotes an electron sheet density of the 2-DEG layer as the first channel layer CH1 when an electric field is not caused between the first channel layer CH1 and the second conductive type substrate 110, i.e., when there is no partial depletion in the first channel layer CH1, E denotes an electric field between the first channel layer CH1 and the second conductive type substrate 110, ε denotes permittivity of each of the second nitride semiconductor layer 140 and the buffer layer 120, q denotes the charge of electrons, t denotes a distance between the first channel layer CH1 and the second conductive type substrate 110, and VO denotes an output voltage.

As shown in Equation 3, when the electron sheet density of the 2-DEG layer as the first channel layer CH1 decreases, a resistance $R_{D1}$ of the first device may increase as shown in Equation 4 below.

$$R_{D1} = \frac{W2}{ns \times q \times \mu_e \times W_{D1}} \qquad \text{[Equation 4]}$$
$$= \frac{W2}{\left(ns_0 - \varepsilon \frac{VO}{qt}\right) \times q \times \mu_e \times W_{D1}}$$

In Equation 4, with reference to FIGS. 3 and 5, W2 denotes a distance between the anode A and the cathode C, $\mu_e$ denotes the mobility of electrons, and WD1 denotes a total width of the first device. As such, when the resistance $R_{D1}$ of the first device increases, current-voltage characteristics illustrated in FIG. 2 may be deteriorated as shown in plot 20.

In the semiconductor devices 100A to 100G according to the embodiments, however, by forming the first first-conductive-type doping layer 170 between the first channel layer CH1 and the second conductive type substrate 110, effects of the electric field between the first channel layer CH1 and the second conductive type substrate 110 on the first channel layer CH1 are prevented and thus the first channel layer CH1 may maintain a constant electron density. Accordingly, the resistance of the first device does not increase and the current-voltage characteristics as shown in plot 10 of FIG. 2 may be kept.

Hereinafter, a method of manufacturing the above-described semiconductor device 100B of FIG. 5 will be described with reference to FIGS. 14a to 14e, but embodiments of the disclosure are not limited thereto. Namely, the semiconductor device 100B may be manufactured using other methods, other than the method illustrated in FIGS. 14a to 14e. In addition, it is obvious that the semiconductor devices 100A and 100C to 100G may also be manufactured by modifying the manufacturing method illustrated in FIGS. 14a to 14e by those skilled in the art.

FIGS. 14a to 14e are sectional views sequentially illustrating a method of manufacturing the semiconductor device 100B of FIG. 5.

Referring to FIG. 14, the substrate 110 is prepared.

The substrate 110 may include a conductive material. For example, the substrate 110 may be a silicon substrate, a silicon carbide substrate, or a GaN substrate, but type of the substrate 110 is not limited to the above-described examples. For example, the substrate 110 may be a silicon substrate having a (111) crystal face as a principal plane and have a thickness of 100 μm to 200 μm.

Subsequently, the substrate 110 is doped with a second conductive type dopant, e.g., a p-type dopant such as B, or the like, in order for the substrate 110 to have the second conductive type.

Thereafter, referring to FIG. 14b, ions are locally implanted into a region of the second conductive type substrate 110 in which the first device is to be formed to form the first first-conductive-type doping layer 170 to a thickness t. For example, when the first first-conductive-type doping layer 170 is a first n-type doping layer, the first first-conductive-type doping layer 170 may be formed by ion-implanting an n-type dopant such as P, AS, or the like into the second conductive type substrate 110.

In addition, the first first-conductive-type doping layer 170 may be formed so as to have a concentration gradient in a depth direction of the second conductive type substrate 110. For example, the first first-conductive-type doping layer 170 may be formed so as to have a decreasing doping concentration from an upper portion of the second conductive type substrate 110 to a lower portion thereof.

Next, referring to FIG. 14c, the buffer layer 120, the second nitride semiconductor layer 140, and the first nitride semiconductor layer 130 are sequentially stacked on the second conductive type substrate 110.

The buffer layer 120 may include at least one of AN, GaN, SiC, or AlGaN. When the buffer layer 120 has a critical thickness or greater, diffusion of silicon atoms from the second conductive type substrate 110 may be prevented and thus occurrence of melt-back may be prevented. For this operation, the buffer layer 120 may have a thickness of tens to hundreds of nanometers, for example, 100 nm to less than 300 nm. In some embodiments, the buffer layer 120 may be omitted.

Each of the first and second nitride semiconductor layers 130 and 140 may be formed using a Group III element-containing nitride by, for example, metal organic chemical vapor deposition (MOCVD). In this regard, the first and third nitride semiconductor layers 130 and 150 are identical, and the second and fourth nitride semiconductor layers 140 and 160 are identical.

Subsequently, referring to FIG. 14d, the contact connector CC electrically connected to the first first-conductive-type doping layer 170 by penetrating the first and second nitride semiconductor layers 130 and 140 and the buffer layer 120 is formed. For example, the contact connector CC may be formed by forming a via hole (not shown) penetrating the first and second nitride semiconductor layers 130 and 140 and the buffer layer 120 and by filling the via hole with a metal material, but embodiments of the disclosure are not limited thereto. The contact connector CC may include a material with electrical conductivity and may be formed as a single layer or multiple layers including at least one of Cr, W, Ti, or Au.

Thereafter, referring to FIG. 14e, the cathode C, the anode A, the gate electrode G, the drain contact D, the source contact S, the device connection part DC, and the metal layer 180 are simultaneously formed. As such, the anode A, the cathode C, the gate electrode G, and the source and drain contacts S and D may be formed of the same material, but embodiments of the present invention are not limited thereto. Each of the cathode C, the anode A, the gate electrode G, the source and drain contacts S and D, the device connection part DC, and the metal layer 180 may be formed as a single layer or multiple layers including at least one of Ni, Au, Pt, Ta, TaN, TiN, Pd, W, or WSi$_2$.

In another embodiment, the anode A, the cathode C, the gate electrode G, the source and drain contacts S and D, the device connection part DC, and the metal layer 180 may be formed of different materials. For example, the gate electrode G may have a structure including multiple layers formed of Ni/Au or a single layer formed of Pt, and each of the source and drain contacts S and D may be formed as multiple layers formed of Ti/Al or Ti/Mo. In addition, the anode A may be formed of a refractory metal or a mixture thereof, and the cathode C may be made of a metal with ohmic characteristics. Each of the device connection part DC and the metal layer 180 may be formed as a single layer or multiple layers including at least one of Cr, Al, Cu, Ti, or Au.

The semiconductor devices according to the above-described embodiments may be applied to various semiconductor circuits such as a DC-to-DC converter, an AC-to-DC converter, an AC-to-AC converter, a DC-to-AC converter, a three-phase circuit motor, a DC stabilizer, and the like.

In addition, the above-described semiconductor circuit may be applied to various devices. For example, the semiconductor circuit illustrated in FIG. 11 may be applied to a three-phase induction motor driving device.

Hereinafter, configuration and operations of the three-phase induction motor driving device including the semiconductor circuit according to the above-described embodiment will be described.

FIG. 15 is a block diagram of a three-phase induction motor driving device according to an embodiment. Referring to FIG. 15, the three-phase induction motor driving device includes a three-phase power supply 310, a rectifier unit 320, a DC stabilizer 330, a conversion unit 340, and a three-phase induction motor 350.

The three-phase power supply 310 supplies a three-phase voltage to the rectifier unit 320. The voltage applied to the rectifier unit 320 from the three-phase power supply 310 may for example be 380 V. The rectifier unit 320 rectifies the voltage supplied from the three-phase power supply 310 and outputs the rectified voltage to the DC stabilizer 330. For example, the voltage rectified by the rectifier unit 320 may be 630 V.

The DC stabilizer 330 stabilizes the voltage rectified by the rectifier unit 320 by reducing the level of the rectified voltage and outputs the stabilized voltage to the conversion unit 340. In this regard, the DC stabilizer 330 may correspond to the semiconductor circuit of FIG. 11. Operations of the DC stabilizer 330 have already been described with reference to FIG. 11.

The conversion 340 converts the stabilized voltage output from the DC stabilizer 330 into a three-phase AC voltage and outputs the three-phase AC voltage to the three-phase induction motor 350. The three-phase induction motor 350 is driven by the three-phase AC voltage output from the conversion unit 340.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Mode for the Invention

Various embodiments have already been described in the best mode.

INDUSTRIAL APPLICABILITY

The semiconductor devices according to the above-described embodiments may be applied to various semiconductor circuits such as a DC-to-DC converter, an AC-to-DC converter, an AC-to-AC converter, a DC-to-AC converter, a three-phase circuit motor, a DC stabilizer, and the like, and the semiconductor circuits according to the above-described embodiments may be applied to various devices such as a three-phase induction motor driving device and the like.

The invention claimed is:

1. A semiconductor device, comprising:
a first conductivity type semiconductor layer including an upper surface, a lower surface, and a first region including a second conductivity type doped region extending from a portion of the upper surface toward the lower surface;
a first nitride semiconductor layer disposed on the upper surface of the first conductivity type semiconductor layer;
a second nitride semiconductor layer disposed on the first nitride semiconductor layer;
a third nitride semiconductor layer disposed on the second nitride semiconductor layer;
a contact connector extending from an upper surface of the third nitride semiconductor layer to a portion of the second conductivity type doped region by passing through the first nitride semiconductor layer and the second nitride semiconductor layer, wherein a first portion of the third nitride semiconductor layer is disposed at a first side of the contact connector and brought together with a first portion of the second nitride semiconductor layer to form a first heterojunction interface, and wherein a second portion of the third nitride semiconductor layer is disposed at a second side of the contact connector and brought together with a second portion of the second nitride semiconductor layer to form a second heterojunction interface;
a first electrode disposed on the third nitride semiconductor layer, wherein the first electrode is configured to be electrically connected to the first heterojunction interface;
a second electrode spaced apart from the first electrode and disposed on the third nitride semiconductor layer, wherein the second electrode is configured to be electrically connected to the second heterojunction interface; and
a third electrode disposed on the contact connector between the first electrode and the second electrode, wherein the third electrode includes a first area contacting the contact connector.

2. The semiconductor device according to claim 1, wherein a first device comprises:
a first portion of the first nitride semiconductor layer disposed at the first side of the contact connector;
the first portion of the second nitride semiconductor layer disposed at the first side of the contact connector and on the first portion of the first nitride semiconductor layer; and
the first portion of the third nitride semiconductor
wherein a second device comprises:
a second portion of the first nitride semiconductor layer disposed at the second side of the contact connector;
the second portion of the second nitride semiconductor layer disposed at the second side of the contact connector and on the second portion of the first nitride semiconductor layer; and
the second portion of the third nitride semiconductor layer.

3. The semiconductor device according to claim 2, wherein each of the first and second devices comprises a Schottky diode or a Heterostructure Field Effect Transistor.

4. The semiconductor device according to claim 3, wherein the first electrode comprises:
a cathode disposed on the first portion of the third nitride semiconductor layer and configured to be electrically connected to a first side of the first heterojunction interface; and
an anode configured to be electrically connected to the contact connector, a second side of the first heterojunction interface, and the third electrode.

5. The semiconductor device according to claim 4, wherein the second electrode comprises:
a drain contact configured to be electrically connected to a first side of the second heterojunction interface and the third electrode;
a source contact configured to be electrically connected to a second side of the second heterojunction interface; and
a gate electrode on the second portion of the third nitride semiconductor layer, between the drain contact and the source contact.

6. The semiconductor device according to claim 3, wherein the first electrode comprises:
a first drain contact configured to be electrically connected to a first side of the first heterojunction interface;
a first source contact configured to be electrically connected to a second side of the first heterojunction interface, the contact connector, and the third electrode; and
a first gate electrode disposed on the first portion of the third nitride semiconductor layer and between the first drain contact and the first source contact.

7. The semiconductor device according to claim 6, wherein the second electrode comprises:
an anode configured to be electrically connected to a first side of the second heterojunction interface; and
a cathode configured to be electrically connected to a second side of the second heterojunction interface and the third electrode.

8. The semiconductor device according to claim 6, wherein the second electrode comprises:

a second source contact configured to be electrically connected to a first side of the second heterojunction interface;

a second drain contact configured to be electrically connected to a second side of the second heterojunction interface and the third electrode; and a second gate electrode disposed on the second portion of the third nitride semiconductor layer and between the second source contact and the second drain contact.

9. The semiconductor device according to claim 2, wherein a sheet doping density Ns of the second conductivity type doped region satisfies the conditions shown in the following equation.

$$N_s > \sqrt{\frac{2\varepsilon V N_a}{q}}$$

wherein ε denotes a permittivity of the second conductivity type doped region, V denotes a maximum reverse bias voltage across the first device, Na denotes a doping concentration of the first conductivity type semiconductor layer, and q denotes an electronic charge.

10. The semiconductor device according to claim 2, further comprising a fourth electrode disposed on the lower surface of the first conductivity type semiconductor layer to face the first and second devices.

11. The semiconductor device according to claim 2, wherein the second conductivity type doped region has a width that is equal to or greater than that of a first heterojunction interface.

12. The semiconductor device according to claim 1, wherein the first conductivity type semiconductor layer includes a second region, the second region including another second conductivity type doped region disposed to surround edges of the second conductivity type doped region disposed in the first region and having a lower doping concentration than that of the second conductivity type doped region disposed in the first region.

13. The semiconductor device according to claim 1, wherein the contact connector comprises:

a first part configured to be connected to the third electrode; and a second part extending from the first part to an inside of the second conductivity type doped region.

* * * * *